(12) United States Patent
Mukai et al.

(10) Patent No.: US 6,613,973 B2
(45) Date of Patent: Sep. 2, 2003

(54) PHOTOVOLTAIC ELEMENT, PRODUCING METHOD THEREFOR, AND SOLAR CELL MODULES

(75) Inventors: Takaaki Mukai, Kyoto (JP); Kimitoshi Fukae, Nara (JP); Akiharu Takabayashi, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/886,087

(22) Filed: Jun. 22, 2001

(65) Prior Publication Data
US 2001/0054436 A1 Dec. 27, 2001

(30) Foreign Application Priority Data

Jun. 27, 2000 (JP) ........................ 2000-192069
Jun. 27, 2000 (JP) ........................ 2000-192070

(51) Int. Cl.[7] .................. H01L 31/06; H01L 31/068; H01L 31/07; H01L 31/075; H01L 31/072
(52) U.S. Cl. .................. 136/255; 136/256; 136/259; 136/261; 438/64; 438/88; 438/92; 438/96; 438/97; 438/98; 205/640
(58) Field of Search ................ 136/244, 246, 136/249, 251, 255, 256, 258, 259, 261, 290; 438/64, 88, 98, 92, 96, 97; 205/640

(56) References Cited

U.S. PATENT DOCUMENTS

| | | | | |
|---|---|---|---|---|
| 4,610,077 A | * | 9/1986 | Minahan et al. | 438/68 |
| 5,320,723 A | * | 6/1994 | Kawakami | 205/656 |
| 5,421,908 A | * | 6/1995 | Yoshida et al. | 136/244 |
| 6,331,672 B1 | * | 12/2001 | Matsuda et al. | 136/256 |
| 6,353,042 B1 | * | 3/2002 | Hanoka et al. | 523/207 |

FOREIGN PATENT DOCUMENTS

| | | |
|---|---|---|
| JP | 6-151914 | 6/1994 |
| JP | 7-302923 | 11/1995 |
| JP | 8-64850 | 3/1996 |
| JP | 11-261086 | 9/1999 |

* cited by examiner

*Primary Examiner*—Nam Nguyen
*Assistant Examiner*—Brian L Mutschler
(74) *Attorney, Agent, or Firm*—Fitzpatrick, Cella, Harper & Scinto

(57) ABSTRACT

A photoelectric conversion layer 13, a transparent electrode layer 14, an insulating layer 15, and a back electrode layer 16 are successively formed in this order on a conductive substrate 11 having a through-hole 17 formed therein, and the transparent electrode layer 14 and the back electrode layer 16 are electrically communicated with each other through the through-hole 17 so as to provide a photovoltaic element in which no grid is employed and improve the productivity and the production yield.

38 Claims, 7 Drawing Sheets

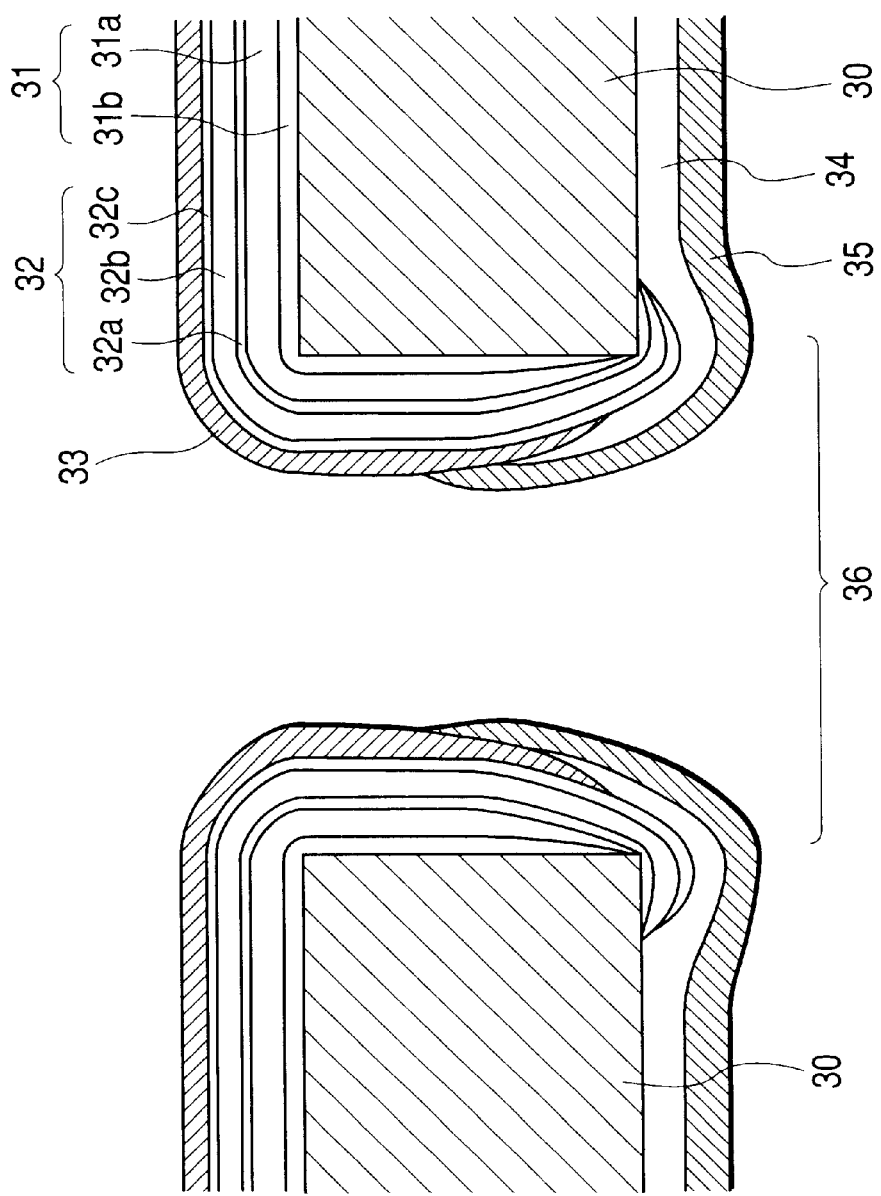

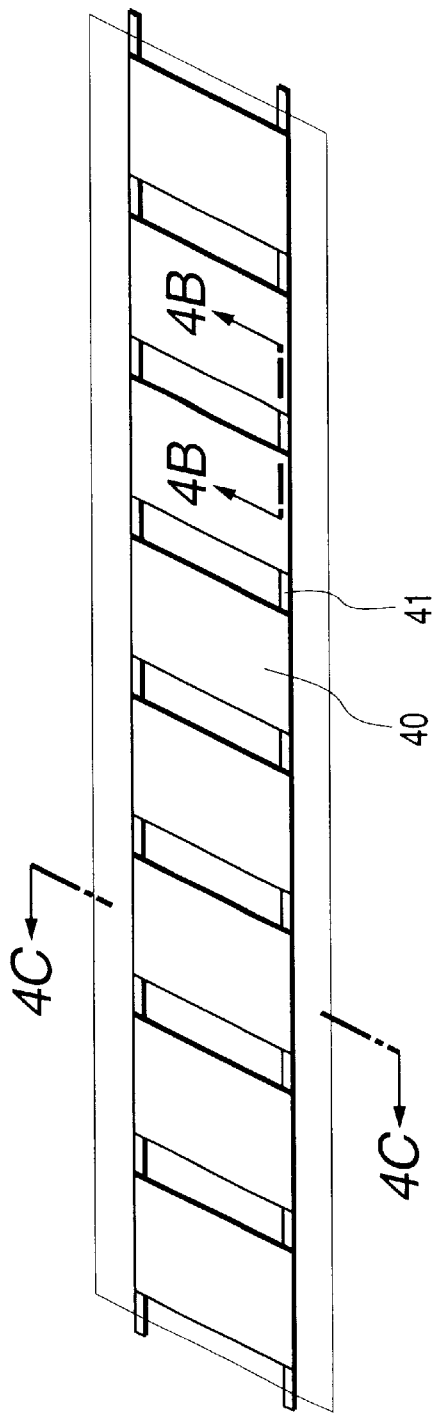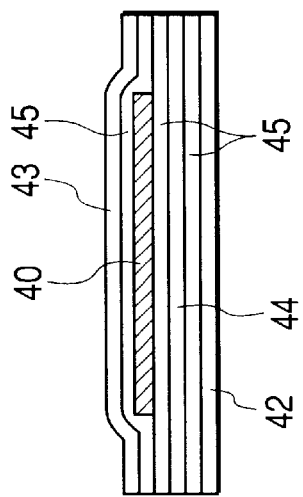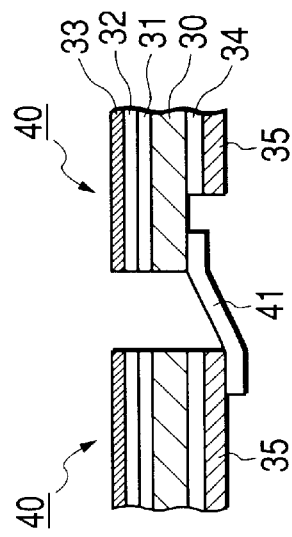

PHOTOVOLTAIC ELEMENT, PRODUCING METHOD THEREFOR, AND SOLAR CELL MODULES

BACKGROUND OF THE INVENTION

1. Field of the Invention

The present invention relates to a photovoltaic element, a producing method therefor, and a solar cell module. More particularly, the present invention relates to a photovoltaic element comprising a substrate having a through-hole formed therein through which electrodes arranged in the front and the back surfaces of the substrate are electrically connected, whereby a grid electrode is made unnecessary and the loss of incident light can be suppressed, a producing method therefore, and a solar cell module using the photovoltaic element. Further, the present invention relates to a photovoltaic element wherein a rectification layer having a rectification characteristic in the reverse direction to the voltage of the photo-electromotive force generated in a photoelectric conversion layer is formed to unit a bypass diode, to improve the processibility and lower the cost, a producing method therefore and a solar cell module using the photovoltaic element.

2. Related Background Art

Recently, in order to solve the problems of depletion of fossil fuel and the environmental problems induced by utilizing fossil fuel, solar energy has drawn attention as clean energy for the next generation.

Many photovoltaic elements used today comprise electrodes formed on a light-receiving face side and a non-light-receiving face side of a photoelectric conversion layer, a transparent electrode transmitting light formed on the light-receiving face side of the photoelectric conversion layer, and a metal electrode formed on the non-light-receiving face side of the photoelectric conversion layer.

The transparent electrode transmitting the light has a high electric resistance as compared with the metal electrode and causes an electric power loss at the time when an electric current flows in the transparent electrode. Hence, a grid electrode is used together for the purpose of lowering the electric power loss due to the transparent electrode. However, the grid electrode shuts out a part of sunlight incident upon the photoelectric conversion layer. Therefore, there occurs another problem that the electric power loss is caused by the grid electrode.

Therefore, many research and investigation institutes have been performing investigation and development of photovoltaic elements capable of suppressing an electric power loss caused by the transparent electrode to the minimum level and making it possible to omit the grid electrode.

Japanese Patent Application Laid-Open No. 6-151914 discloses a photovoltaic element having a structure in which a hole is formed in a photoelectric conversion layer with excimer laser and a light-receiving face electrode film formed on the light-receiving face side of the photoelectric conversion layer and a back electrode film formed in the non-light-receiving face side are electrically connected through the hole. The electric charge generated in the light-receiving face of the photoelectric conversion layer flows from the light-receiving face electrode film to the back electrode film through the hole, so that a grid electrode can be omitted, and the photovoltaic element has an advantage that the electric power loss attributed to the shadow of the grid electrode can be removed.

Further, in order to further simplify the production of the photovoltaic element in which a grid electrode is omitted, there are many ideas proposed relevant to the producing method in which the hole is formed in the initial stage of the production process and after that thin films are successively stacked, and the like.

Japanese Patent Application Laid-Open No. 8-64850 discloses a method of producing a photovoltaic element by successively forming an insulating layer on one side of a metal substrate having through-holes at constant intervals, a photoelectric conversion layer and further a transparent electrode layer on the other side, and a back electrode layer on the one side. Also, Japanese Patent Application Laid-Open No. 11-261086 proposes a method of producing a photovoltaic element by forming an insulating layer and a back electrode layer on a conductive substrate and then forming through-holes or recessed portions, and further successively stacking a photoelectric conversion layer and a transparent electrode layer.

The respective semiconductor layers of a photovoltaic element are generally formed by chemical vapor deposition, a sputtering method and the like in vapor phase or vacuum. In the case of forming the layers by these methods, in order to prevent a thin film composition adhered to the inner walls of a film formation apparatus from dropping on the processing face of a substrate or the like, it is preferable to carry out film formation in the state of facing downward the face of the substrate on which a layer is to be deposited.

However, in the method of producing a photovoltaic element disclosed in Japanese Patent Application Laid-Open No. 8-64850, layers are formed in the order on a non-light-receiving face side, a light-receiving face side, and a non-light-receiving face side of a substrate. For that, when film formation is carried out in the state of facing downward the face of the substrate on which a layer is to be deposited, the production process is divided into a first step of forming an insulating layer on the non-light-receiving face side of the substrate, a second step of forming a photoelectric conversion layer and a transparent electrode layer on the light-receiving face side of the substrate, and a third step of forming a back electrode layer on the non-light-receiving face side of the substrate. As a result, apparatuses are required to be made ready for respective steps. Like this, division of the process of forming the layers on the non-light-receiving face side of the substrate into two steps requires a long time necessary for production of the photovoltaic element, an increased number of apparatuses, and increased labor of workers. Also the cost of the photovoltaic element is elevated.

On the other hand, the method of producing the photovoltaic element proposed in Japanese Patent Application Laid-Open No. 11-261086 comprises forming through-holes after an insulating layer and a back electrode layer are stacked on a conductive substrate. For that, when the perforation process is carried out by a laser processing method or a mechanical processing method, it is required to prevent melting of a metal by heat and electric communication of the conductive substrate and the back electrode owing to the burr generated by the mechanical force.

Further, since the output voltage is generally insufficient in case of only one photovoltaic element, a plurality of photovoltaic elements connected in series are used. However, in case of connecting a plurality of photovoltaic elements in series, the following problems occur.

In the case some of elements become impossible to generate electric power owing to that the sun rays are shut by shadows of buildings, snow fall or the like, the whole generated voltage from normally working other elements is applied as inverse voltage to the elements which do not generate electric power. If the inverse voltage exceeds the withstand voltage of the elements, the probability of breakdown of the elements is elevated. In order to avoid that, bypass diodes are connected in parallel in the inverse direction for the respective photovoltaic elements connected in series. Japanese Patent Application Laid-Open No. 7-302923 proposes photovoltaic elements connected with bypass diodes having lead wires made of a metal foil material.

However, the photovoltaic elements disclosed in Japanese Patent Application Laid-Open No. 7-302923 require a work of connecting bypass diodes to an electrode of each one of the photovoltaic elements and thus the work is complicated and mass production in-a-line is made difficult.

Further, if bypass diodes are attached after formation of the respective layers constituting the photovoltaic elements, the flatness of the parts where the bypass diodes are formed is deteriorated. As a result, at the time of performing any processing on the photovoltaic elements, the stress is applied concentrically upon the bypass diodes and the bypass diodes are possibly broken.

SUMMARY OF THE INVENTION

An object of the present invention is to solve the above described problems respectively or as a whole, and to provide a through-hole type photovoltaic element with excellent productivity and production yield; a producing method therefore, and a solar cell module using the photovoltaic element.

For such object, the present invention provides a photovoltaic element comprising a conductive substrate having a through-hole, a transparent electrode layer and a photoelectric conversion layer in this order from a light-receiving face side on the major surface of the light-receiving face side of the conductive substrate, an insulating layer and a back electrode layer in this order from the light-receiving face side on the major surface of the non-light-receiving face side of the conductive substrate; wherein the foregoing photoelectric conversion layer and the foregoing transparent electrode layer are formed continuously from the major surface on the light-receiving face side to at least a part of the inner wall face of the foregoing through-hole; the foregoing insulating layer and the foregoing back electrode layer are formed continuously from the major surface of the non-light-receiving face side to at least a part of the inner wall face of the foregoing through-hole; the foregoing photoelectric conversion layer, the foregoing transparent electrode layer, the foregoing insulating layer, and the foregoing back electrode layer are successively stacked in this order in at least a part of the inner wall face of the foregoing through-hole; and the foregoing transparent electrode layer and the foregoing back electrode layer are electrically communicated through the foregoing through-hole.

Further, the present invention provides a method of producing a photovoltaic element comprising a conductive substrate having a through-hole, a transparent electrode layer and a photoelectric conversion layer in this order from a light-receiving face side on the major surface of the light-receiving face side of the conductive substrate, and an insulating layer and a back electrode layer in this order from the light-receiving face side on the major surface of the non-light-receiving face side of the conductive substrate; wherein the method comprises a first step of successively forming the photoelectric conversion layer and the transparent electrode on the major surface of the light-receiving face side of the foregoing conductive substrate and on the inner wall face of the through-hole and a second step of successively forming the insulating layer and the back electrode layer on the major surface of the non-light-receiving face side of the foregoing conductive substrate and on the inner wall face of the through-hole.

According to the photovoltaic element of the present invention, since the electric current generated in the photoelectric-conversion layer is led to the back electrode layer from the transparent electrode layer through the through-hole or to the transparent electrode layer from the back electrode layer, no grid electrode is required to be formed on the light-receiving face of the photovoltaic element. Consequently, the loss owing to the shadow of the grid electrode itself can be eliminated.

Further according to the producing method of the photovoltaic element of the present invention, the photoelectric conversion layer, the transparent electrode layer, the insulating layer, the back electrode layer are formed in this order on the conductive substrate having the through-hole, whereby a plurality of layers such as semiconductor layers to be formed on one face of the substrate can be formed in a step one time. Since the respective layers can efficiently be formed, the productivity is high.

That is, the photoelectric conversion layer and the transparent electrode layer are formed on the light-receiving face side of the conductive substrate and then the insulating layer and the back electrode layer are formed in the non-light-receiving face, so that the semiconductor layers and the like to be formed on one side of a substrate can be formed in one step. Consequently, the number of the steps can be lessened.

Further, another object of the present invention is to provide a through-hole type photovoltaic element integrated with bypass diodes excellent in productivity and processibility, a producing method therefor, and a solar cell modules using it.

For such object, the present invention provides a photovoltaic element comprising a conductive substrate having a through-hole, a transparent electrode layer and a photoelectric conversion layer in this order from a light-receiving face side on the major surface of the light-receiving face side of the conductive substrate, wherein the photovoltaic element further comprises a rectification layer and a back electrode layer in this order from the light-receiving face side on the major surface of the non-light-receiving face side of the conductive substrate; the foregoing photoelectric conversion layer and the foregoing transparent electrode layer are formed continuously from the major surface on the light-receiving face side to at least a part of the inner wall face of the foregoing through-hole; the foregoing rectification layer and the foregoing back electrode layer are formed continuously from the major surface of the non-light-receiving face side to at least a part of the inner wall face of the foregoing through-hole; the foregoing transparent electrode layer and the foregoing back electrode layer are electrically communicated with each other through the through-hole; and the rectification characteristic of the foregoing rectification layer is in the inverse direction to the voltage of the photoelectric motive force of the foregoing photoelectric conversion layer.

Further, the present invention provides a method of producing a photovoltaic element comprising a conductive substrate having a through-hole, a transparent electrode layer and a photoelectric conversion layer in this order from the light-receiving face side on the major surface of the light-receiving face side of the conductive substrate, and a rectification layer and a back electrode layer in this order from the light-receiving face side on the major surface of the non-light-receiving face side of the conductive substrate; wherein the method comprises a first step of successively forming the photoelectric conversion layer and the transparent electrode on the major surface of the light-receiving face side of the foregoing conductive substrate and on the inner wall face of the through-hole and a second step of successively forming the rectification layer and the back electrode layer on the major surface of the non-light-receiving face side of the foregoing conductive substrate and on the inner wall face of the through-hole.

According to the photovoltaic element of the present invention, since the rectification layer formed on the major surface of the non-light-receiving face side of the conductive substrate has the rectification characteristic in the inverse direction to the voltage of the photoelectric motive force of the photoelectric conversion layer, the layer performs a function as a bypass diode. Consequently, at the time when the voltage in the inverse direction is applied to the photovoltaic element, the electric current generated flows through the rectification layer, so that breakdown of the photoelectric conversion layer owing to the voltage in the inverse direction can be prevented.

Also, since the bypass diode functioning as the rectification layer is integrated with the photovoltaic element, no work for attaching bypass diodes one by one to the photovoltaic element in a post step is made unnecessary and consequently the productivity is improved. Further, since the bypass diode is integrated as the rectification layer, the flatness of the photovoltaic element is improved and the photovoltaic element can easily be processed.

Further, the present invention provides a solar cell module comprising photovoltaic elements described above wherein at least a part of the photovoltaic element is coated with a sealing material. Consequently, each photovoltaic element is provided with heat resistance, weathering resistance, insulation breakdown resistance, and the like, thereby resulting in improvement of the reliability of each photovoltaic element.

Other characteristics and effects of the present invention will be described in details later with reference to the drawings.

BRIEF DESCRIPTION OF THE DRAWINGS

FIG. 3 is a sectional view of a through-hole part of the photovoltaic element according to the Example 1;

FIG. 4A is a diagrammatic entire perspective view showing the solar cell module according to Example 2, FIG. 4B is a magnified sectional view showing the electric connection part B of the photovoltaic element of FIG. 4A, and FIG. 4C is a sectional view taken along the line 4C—4C in the FIG. 4A;

DETAILED DESCRIPTION OF THE PREFERRED EMBODIMENTS

Figure 1A:
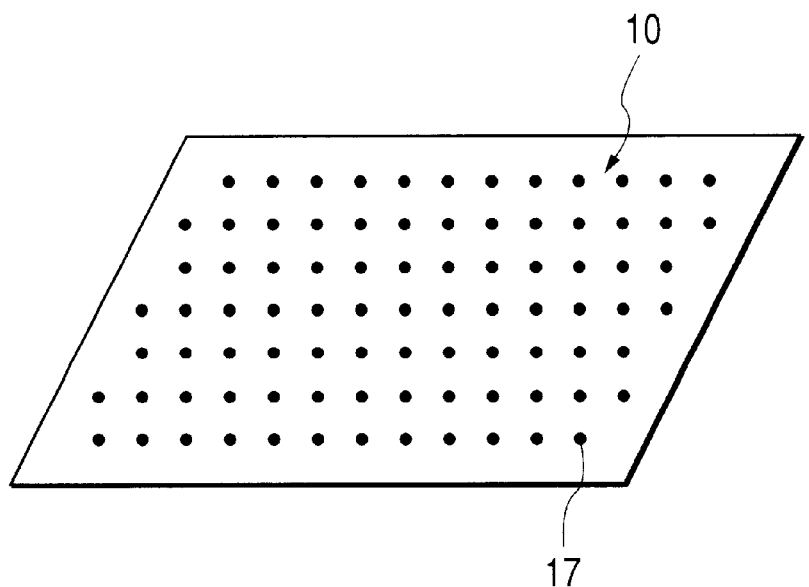
FIG. 1A is a diagrammatic perspective view showing the photovoltaic element according to an embodiment of the present invention.

As an embodiment of the present invention, the photoelectric conversion layer may be formed continuously from the major surface of the light-receiving face side to at least a part of the major surface of the non-light-receiving face side through the inner wall surface of a through-hole. By forming in such a manner, even if the transparent electrode layer to be formed in light-receiving face side of the photoelectric conversion layer is formed from the major surface to a deep part of a through-hole, the transparent electrode layer and the conductive substrate are prevented from being electrically communicated with each other (short-circuit) and thus it is preferable.

Further, as an embodiment of the present invention, it is more preferable to arrange the conductive substrate so as to leave burr or burr residues generated in through-hole formation of the conductive substrate on the non-light-receiving face. By arranging in such a manner, occurrence of short-circuit faults owing to burr or the like can be prevented. In the sections where burr is formed, since the thin film composition is hard to be deposited to form parts thin in the thickness as compared with other parts and parts where no film is formed (pin holes) and thereby the short-circuit faults easily take place, and therefore it is preferable to form a thin film in a rather thick thickness. On the other hand, from a viewpoint that the performance of the photovoltaic element is the highest priority item, the film thickness of the photoelectric conversion layer and the transparent electrode layer to be formed on the light-receiving face side of the conductive substrate can not be made thick as the countermeasure against the short-circuit faults since the film thickness of the photoelectric conversion layer and the transparent electrode layer to be formed on the light-receiving face side of the conductive substrate is a very important factor affecting the conversion efficiency of the solar cell. Hence, since the insulating layer and the back electrode layer do not lower the conversion efficiency of the solar cell even if they are made thick in the film thickness, burr is so arranged as to be disposed on the non-light-receiving face side of the conductive substrate where the insulating layer and the back electrode layer are to be formed, so that occurrence of short-circuit faults owing to the burr can be prevented while the photoelectric conversion efficiency is maintained.

Further, in the case where the shape of a through-hole of a photovoltaic element of the present invention is approximately circular by observation from the major surface side, it is preferable to adjust T/D to be 1 or lower wherein T denotes the thickness of the conductive substrate and D denotes the hole diameter of the through-hole. Further, in the case where the shape of a through hole is approximately rectangular by observation from the major surface side, it is preferable to adjust T/L to be 1 or lower wherein T denotes the thickness of the conductive substrate and L denotes the width of the through-hole in the shorter side. If the opening surface area of a through-hole becomes smaller in relation to the depth of the through-hole, the thin film composition becomes difficult to reach a part deep in the through-hole and the amount of a layer to be deposited decreases, and as a result, by controlling these ratios in such a manner, it is inhibited to obtain an unsufficient film thickness.

In an embodiment of the present invention, it is preferable to have a back reflection layer between the conductive substrate and the photoelectric conversion layer of a photovoltaic element. Since the light not absorbed in the photoelectric conversion layer can be reflected to the photoelectric conversion layer, a back reflection layer capable of improving the utilization efficiency of sunlight may be continuously formed from the major surface of the light-receiving face side to at least a part of the inner wall surface of a through-hole.

Further, the back reflection layer is preferably formed from the major surface of the light-receiving face side to at least a part of the major surface of the non-light-receiving face side through the inner wall surface of the through-hole. Because of such constitution, the burr generated on the non-light-receiving face side of the conductive substrate can be coated with the back reflection layer. Consequently, the unevenness of the burr can be leveled, so that it can be avoided that semiconductor layers and the like are not formed in a sufficient thickness at the points where burr is generated, and occurrence of short-circuit faults can be prevented.

Further, the back reflection layer is preferable to be composed of a back metal layer and a back semiconductor layer.

A photovoltaic element of the present invention is preferable to comprise the photoelectric conversion layer with any of a PN junction, a PIN junction, a hetero junction and a Schottky barrier. Further, the photoelectric conversion layer is preferable to be made of amorphous, crystalline, or their mixture-phase material. Further, the photoelectric conversion layer is composed of any of an amorphous silicon-based semiconductor, a microcrystalline silicon-based semiconductor, a polycrystalline silicon-based semiconductor, and polycrystalline compound type semiconductor.

In the present invention, the photovoltaic element is preferable to comprise a conductive substrate made of a flexible metal plate. Such constitution can provide the photovoltaic element with flexibility and it is therefore preferable.

Also, at the time of forming through-hole in the conductive substrate, the processing is so carried out as to generate burr mainly on the non-light-receiving face side of the conductive substrate. This can lower the probability of occurrence of short-circuit faults by stacking an insulating layer, which can be altered in the film thickness without affecting the conversion efficiency, in a rather thick thickness and it is therefore preferable. Specifically, if the step of forming the through-holes is a punching process using dies comprising a punch and a die, it is preferable to punch the conductive substrate from the light-receiving face side while arranging the punch on the light-receiving face side of the conductive substrate and the die on the non-light-receiving face side. With such constitution, burr is not formed on the light-receiving face side but on the non-light-receiving face side. Also, in the case of the through-hole formation step by laser processing, burr can be formed on the non-light-receiving face side of the conductive substrate by irradiating the substrate with laser beam from the light-receiving face side of the conductive substrate.

Further, it is preferable to insert a step of removing burr generated at the time of forming through-hole between the step of forming through-hole and the first step. The unevenness of layers can be suppressed and occurrence of short-circuit faults can be prevented. The step of removing burr may be electrolytic polishing.

In the present invention, the step of forming the photoelectric conversion layer is preferably conducted by a chemical vapor deposition method.

A step of selectively removing the transparent electrode may be inserted between the first step and the second step. By selectively removing the transparent electrode, the transparent electrode can be removed in the peripheral portions of the points where short-circuit possibly takes place and decrease of the production yield can therefore be suppressed. The step of removing the transparent electrode layer in the foregoing peripheral portions of the points where short-circuit possibly takes place may be carried out using the electrolytic reaction caused by voltage application between the conductive substrate and a counter electrode in an electrolytic solution.

Further, in the second step, the insulating layer or the rectification layer is preferable to be formed by a chemical vapor deposition method.

Hereinafter, although the preferable embodiments of a photovoltaic element, a producing method therefor and a solar cell module according to the present invention will be described more particularly, the present invention is not at all limited to the following embodiments.

Figure 1B:
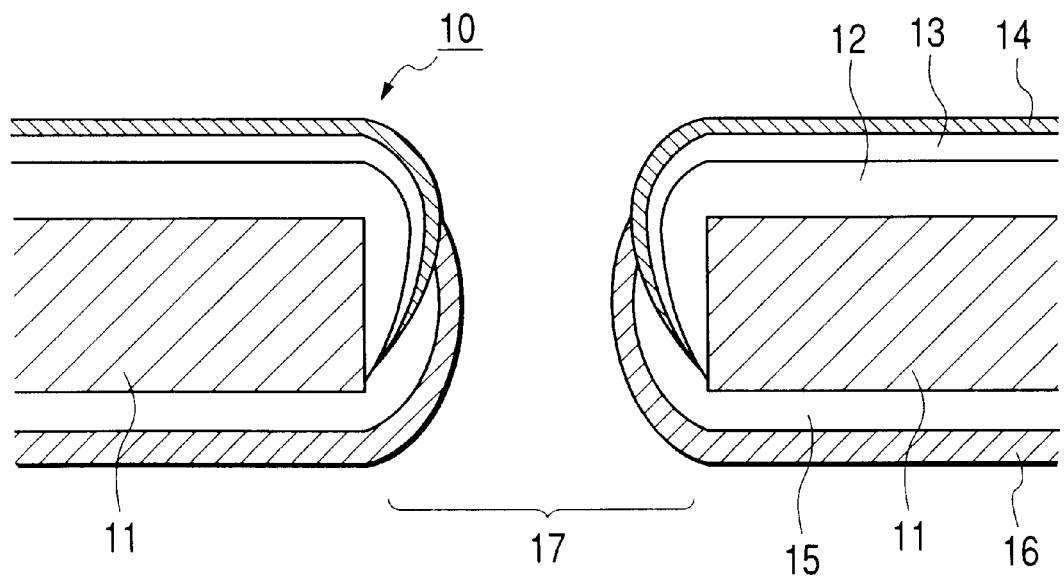
FIG. 1B is a magnified sectional view of a through-hole part of the photovoltaic element of FIG. 1A.

FIG. 1A shows a diagrammatic perspective view showing an example of a photovoltaic element of the present invention and FIG. 1B shows a magnified sectional view of a through-hole part.

The photovoltaic element 10 comprises a conductive substrate 11 having through-hole 17, a back reflection layer 12 formed on the major surface of the light-receiving face side of the conductive substrate, a photoelectric conversion layer 13 formed on the light-receiving face side of the back reflection layer, a transparent electrode layer 14 formed on the light-receiving face side of the photoelectric conversion layer, an insulating layer 15 formed on the major surface on the non-light-receiving face side of the conductive substrate, and a back electrode layer 16 formed on the non-light-receiving face side of the insulating layer. The back reflection layer 12, the photoelectric conversion layer 13, the transparent electrode layer 14, the insulating layer 15, the back electrode layer 16 are formed continuously from the major surface on the light-receiving face side or the non-light-receiving face side to at least a part of the inner wall face of the foregoing through-hole 17. Also, in at least a part of the inner wall surface of through-hole 17, the back reflection layer 12, the photoelectric conversion layer 13, the transparent electrode layer 14, the insulating layer 15, and the back electrode layer 16 are formed in this order. Incidentally, the back reflection layer 12 is dispensable in the present invention.

The transparent electrode layer 14 and the back electrode layer 16 are electrically connected on the inner wall surface of the through-hole 17. The electric current generated in the photoelectric conversion layer 13 flows from the transparent electrode layer to the back electrode layer or from the back electrode layer to the transparent electrode layer. Consequently, a grid electrode is made unnecessary and loss attributed to the shadow of the grid electrode is eliminated.

In order to prevent the photoelectric conversion layer 13 from short-circuit, a first electrode composed of the transparent electrode layer 14 and the back electrode layer 16 and a second electrode composed of the back reflection layer 12 and the conductive substrate 11 are not electrically communicated with each other.

The method of producing a photovoltaic element according to the present invention comprises a first step of forming the through-hole 17 in the conductive substrate 11, a second step of successively forming the back reflection layer 12, the photoelectric conversion layer 13, and the transparent electrode layer 14 on the major surface of the light-receiving face side of the conductive substrate 11 and on the inner wall face of the through-hole 17, and a third step of successively forming the insulating layer 15 and the back electrode layer 16 on the major surface of the non-light-receiving face side of the conductive substrate 11 and on the inner wall face of the through-hole 17. Incidentally, the back reflection layer 12 and the photoelectric conversion layer 13 may be formed on the conductive substrate 11 in which the through-hole 17 are previously formed.

Further, the second step and the third step process can be carried out by a roll to roll system.

In the roll to roll system, while a conductive substrate in a belt-like shape and having flexibility is continuously transported in the longitudinal direction to a plurality of deposition chambers, semiconductor layers and the like are formed in the respective deposition chambers. This system has a feature that the system is capable of continuously forming a plurality of layers. In the case where layers are formed using the roll to roll system while the face of the substrate on which the layers to be deposited is faced down, the producing method disclosed in Japanese Patent Application Laid-Open No. 8-64850 requires roll replacement two times, whereas the producing method of the present invention only requires one time roll replacement.

Figure 6A:
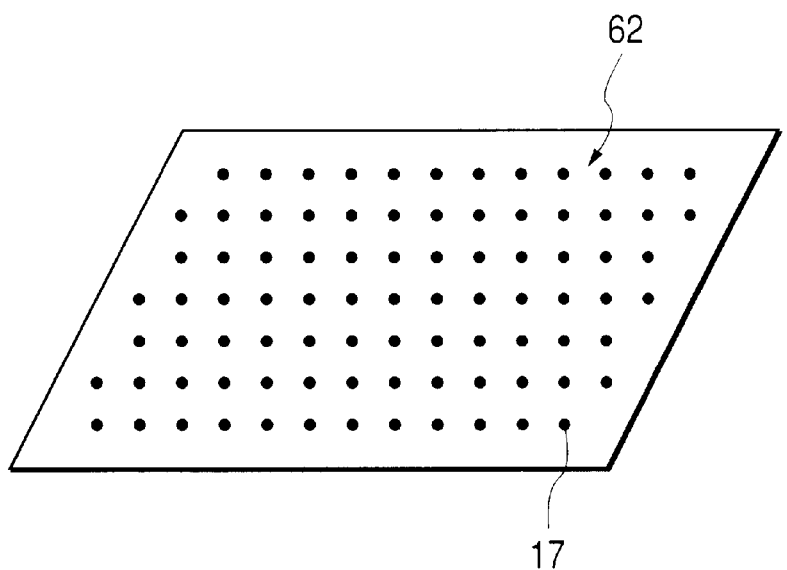
FIG. 6A is a diagrammatic perspective view showing the photovoltaic element according to an embodiment of the present invention.
Figure 6B:
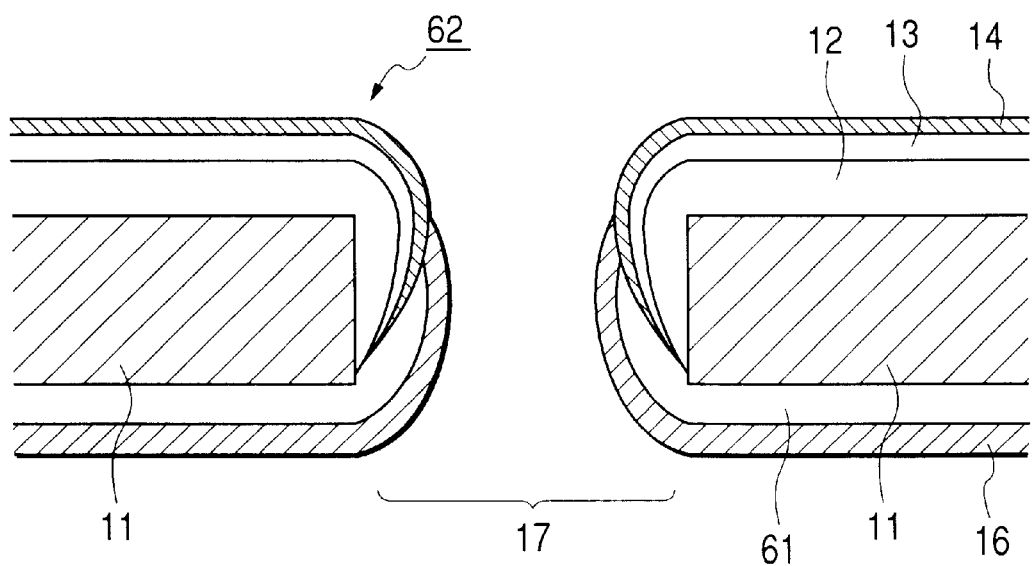
FIG. 6B is a magnified sectional view of a through-hole part of the photovoltaic element of FIG. 6A.

FIG. 6A is a diagrammatic perspective view showing the photovoltaic element of another embodiment of a photovoltaic element of the present invention and FIG. 6B is a magnified sectional view of a through-hole part.

The photovoltaic element 62 is the same as the photovoltaic element 10 shown in FIGS. 1A and 1B except that a rectification layer 61 is used in place of the insulating layer 15. The rectification layer 61 is formed on the major surface of the non-light-receiving face side of the conductive substrate and has a rectification characteristic. The back reflection layer 12, the photoelectric conversion layer 13, the transparent electrode layer 14, the rectification layer 61 and the back electrode layer 16 are continuously formed from the major surface of the light-receiving face side or the non-light-receiving face side to at least a part of the inner wall face of the through-hole 17. Incidentally, the back reflection layer 12 is dispensable in the present invention.

The rectification characteristic of the rectification layer 61 is in the inverse direction to the direction of voltage generated by photo-electromotive force of the photoelectric conversion layer 13. At the time when the voltage in the inverse direction is applied to the photoelectric conversion layer 13, the reverse current is bypassed to the photoelectric conversion layer 61, so that the breakdown of the photoelectric conversion layer by the voltage in the inverse direction can be prevented. That is, the rectification layer 61 has a function as a bypass diode.

The method of producing the photovoltaic element of the present invention comprises a first step of forming the through-holes 17 in the conductive substrate 11, a second step of successively forming the back reflection layer 12, the photoelectric conversion layer 13, and the transparent electrode layer 14 on the major surface of the light-receiving face side of the conductive substrate 11 and on the inner wall face of the through-holes 17, and a third step of successively forming the rectification layer 61 and the back electrode layer 16 on the major surface of the non-light-receiving face side of the conductive substrate 11 and on the inner wall face of the through-holes 17. Incidentally, the back reflection layer 12 and the photoelectric conversion layer 13 may be formed on the conductive substrate 11 in which the through-holes 17 are previously formed.

Next, the requirements for respective components used in the present invention will be described in details.

Conductive Substrate

The conductive substrate is preferable to function as a supporting substrate for supporting the respective layers so as to prevent them from being broken by the force applied from the outside.

Practical materials for the conductive substrate are thin sheets of metals such as Fe, Ni, Cr, Al, Mo, Au, Nb, Ta, V, Ti, Pt, Pb and the like or of their alloys or their composites, however the materials are not limited to the above.

The surface of the conductive substrate may be smooth or have finely projected and recessed face. The projected and recessed shape is preferably spherical, conical, and pyramidal and the maximum value Rmax of the differences between the peaks and the bottoms of the projected and recessed face is preferably 0.05 to 2 $\mu$m. Consequently, in the case where no back reflection layer is formed in the conductive substrate, diffused reflection of light rays is caused by the projected and recessed face of the conductive substrate and the optical path length of the reflected light rays is elongated. In terms of production and handling and also from the viewpoint of the mechanical strength of the substrate, the thickness of the substrate is preferably 10 $\mu$m or longer in general.

Through-hole

Owing to the through-hole, the electric charge generated by light absorption of the photoelectric conversion layer can be led to the back electrode layer having a high electroconductivity only through the necessary minimum distance of the transparent electrode layer having a high resistance. Like this, the through-hole can work as bypasses.

Figure 5:
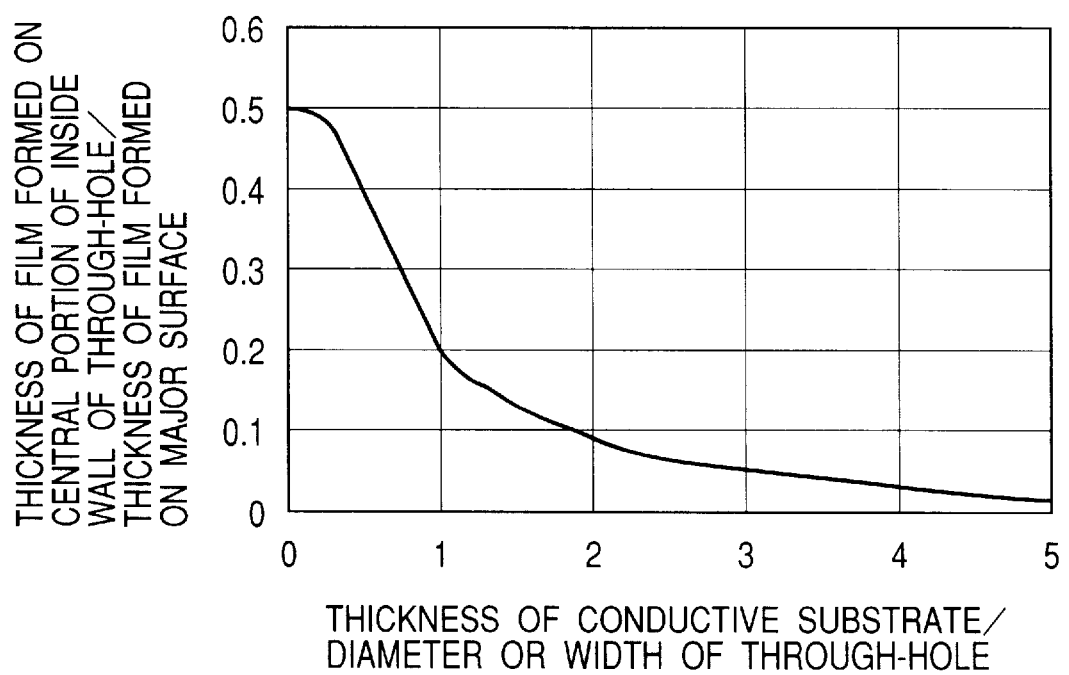
FIG. 5 is a graph showing the film thickness ratio in relation to the aspect ratio of a through hole in the present invention.

FIG. 5 shows the correlation of the layer thickness ratio ((the thickness a layer formed on the center part of an inner wall of a through hole)/(the thickness of a layer formed on the main surface)) of the layers formed by a sputtering method and the aspect ratio of a through hole (T/D or T/L). The reference character T denotes the thickness of the substrate and the reference character D is the hole diameter in the case where the shape of the through-hole is circular. The reference character L denotes the width of the short side direction in the case where the shape of the through-hole is rectangular. In the present invention, the through-hole is preferable to be formed so as to satisfy that T/D is 1 or less in case of a circular shape for the through-hole and that T/L is 1 or less in case of a rectangular shape for the through-hole. That is for assuring 20% or more layer thickness for the layer to be formed in the center part of the inner wall of the through-hole as compared with the layer thickness of the layer to be formed on the major surface of the substrate at the time when the layer is to be continuously formed from the major surface of the substrate to the inner wall face of the through-hole by a sputtering method. If the layer thickness is thinner than 20%, the partial short-circuit parts increase and that sometimes makes it impossible to obtain sufficient characteristics.

As a method for perforating the conductive substrate to form the through-hole, applicable are mechanical processing methods such as a pressing process, sand blasting process, processing methods employing energy beam such as laser beam, ion beam, electron beam and the like, and chemical processing methods such as an etching method, however the method is not limited to these methods.

Back Reflection Layer

The back reflection layer takes a role as a light reflection layer for reflecting the light, which the photoelectric conversion layer cannot absorb and are transmitted through the photoelectric conversion layer, again to the photoelectric conversion layer side. The back reflection layer is positioned between the conductive substrate and the photoelectric conversion layer. The materials usable as the back reflection layer include metals such as Au, Ag, Cu, Al, Ni, Fe, Cr, Mo, W, Ti, Co, Ta, Nb, Zr and the like and alloys such as a stainless steel and the like. Among them, metals with high reflectivity such as Al, Cu, Ag, Au and the like are especially preferable.

Further, although the shape of the surface of the back reflection layer may be flat, the projected and recessed shape capable of scattering light is more preferable. Owing to the projected and recessed shape scattering light with which the back reflection layer is provided, the back reflection layer can scatter the light rays having long wavelength which the photoelectric conversion layer cannot absorb, and the optical path length is elongated, whereby the sensitivity of the photovoltaic element to the long wavelength is improved, the short-circuit current is increased and the photoelectric conversion efficiency can be improved. The projected and recessed shape is preferable to have the maximum value Rmax of the difference between the peaks and the bottoms of the projected and recessed shape from 0.2 $\mu$m to 2.0 $\mu$m.

To form the back reflection layer, applicable methods are an evaporation method, a sputtering method, a plating method, a printing method and the like. Further, in order to form the projected and recessed shape, a film of a formed metal or alloy may be subjected to dry etching, wet etching, sand blasting, heating treatment. Also, while the substrate is heated, a metal or an alloy is evaporated to form the projected and recessed shape for scattering the light. Other than that, the projected and recessed shape can be formed by forming a semiconductor layer of ZnO or the like on the film of the formed metal or alloy.

Photoelectric Conversion Layer

The photoelectric conversion layer has a function of converting light into electric power and is formed on the transparent electrode layer on the non-light-receiving face side. The materials usable for the photoelectric conversion layer are an element belonging to the Group IV of the Periodic Table (IV-group element) such as Si, C, Ge or the like, a IV-group element-containing alloy such as SiGe, SiC or the like, a III–V group element-containing compound such as GaAs, InSb, GaP, GaSb, InP, InAs or the like, a II–VI group element-containing compound such as ZnSe, CdTe, ZnS, Cds, CdSe, GdTe or the like, and a I–III–VI group element-containing compound such as $CuInSe_2$ or the like, however they are not limited to these elements and compounds. Among the foregoing materials, those especially preferable to be used for the photoelectric conversion layer of the present invention are IV-group elements such as a-Si:H (hydrogenated amorphous silicon) a-SiGe:H, a-SiC:H and the like. Not only amorphous but also microcrystalline materials may be used. That is because it is supposed that these materials have physical properties, such as a band gap, Fermi level and the like, relatively easy to be controlled and are thus suitable for altering the characteristic values of the photovoltaic element.

The photoelectric conversion layer has at least one pair of the pn junction, the pin junction, the hetero junction or a Schottky barrier. Preferable formation methods for the photoelectric conversion layer include a variety of chemical vapor deposition method such as a microwave plasma CVD method, a VHF plasma CVD method, a RF plasma CVD method and the like.

Transparent Electrode Layer

The transparent electrode layer has not only a role as an electrode for transmitting light in the light incident side but also a role as a reflection preventing film by being optimized in the film thickness. The transparent electrode layer is required to have a high transmissivity in the wavelength region of light which the photoelectric conversion layer can absorb and a low resistance. More particularly, the transmissivity is preferably 90% or higher at 600 nm. The resistance is preferably $5 \times 10^{-3}$ $\Omega$cm or lower and more preferably $1 \times 10^{-3}$ $\Omega$cm or lower. The materials usable for the layer are preferably conductive oxides of $In_2O_3$, $SnO_2$, $ITO(In_2O_3 + SnO_2)$, ZnO, CdO, $Cd_2SnO_4$, $TiO_2$, $Ta_2O_5$, $Bi_2O_3$, $MoO_3$, $Na_xWO_3$ and the like and mixtures of these oxides. Further an element (dopant) changing the conductivity of these compounds may be added.

As the elements changing the conductivity, their examples are Al, In, B, Ga, Si, F and the like in the case where the transparent electrode layer is of ZnO; Sn, F, Te, Ti, Sb, Pb and the like in the case of $In_2O_3$; and F, Sb, P, As, In, Ti, Te, W, Cl, Br, I and the like in the case of $SnO_2$.

The preferable method for forming the transparent electrode layer is a method of forming a layer by sputtering using a sputtering gas containing a slight amount of oxygen.

Insulating Layer

The insulating layer is formed between the back electrode layer and the conductive substrate, and thus the back electrode layer and the conductive substrate are kept electrically insulated.

The representative materials for the insulating layer are inorganic materials such as $SiO_2$, $Si_3N_4$, $MgF_2$, $Al_2O_3$, $TiO_2$, ZnS, $CeF_3$, $ZrO_2$ and the like, and the applicable formation methods are a chemical deposition method, a sputtering method, a vacuum evaporation method, an electrodeposition method and the like.

Beside the inorganic materials, the insulating layer may be formed by using polymer resins such as a polyester, an ethylene-vinyl acetate copolymer, an acrylic resin, an epoxy resin, an urethane resin and the like.

The examples of the method for forming the insulating layer by using the polymer resins are a method by dissolving the resin in a solvent and applying the resin solution by spin coating or dipping; a method by melting the resin by heat and coating the resin by a roller, a method by depositing the resin by electrolytic polymerization, a method by depositing the resin by electrodeposition, a method utilizing plasma polymerization and the like, and the methods are properly selected and determined depending on the physical properties of the polymer resins, the desired film thickness, and other various conditions, however, in terms of mass productivity, the dipping method, the roller coating method, and the electrodeposition method and the like are preferable.

The thickness of the insulating layer is determined based on the requirements that the layer is free from pin holes and provided with sufficient barrier properties to the humidity, adhesion strength and flexibility. If the thickness is 1 µm or less, pin holes are easily formed and if the thickness is 30 µm or more, the flexibility is deteriorated and therefore the thickness is preferable within about 1 to about 30 µm.

Back Electrode Layer

The back electrode layer is a current collection electrode formed so as to collect the electric charge generated on the light-receiving face side of the photoelectric conversion layer through the through-holes. As practical materials for the layer, usable are metals such as Al, Ag, Au, Cu, Ti, Ta, W and the like, however they are not limited to these materials. Methods preferable to be employed for forming the back electrode layer are a chemical vapor deposition method, a sputtering method, and the like.

Solar Cell Module

Figure 2A:
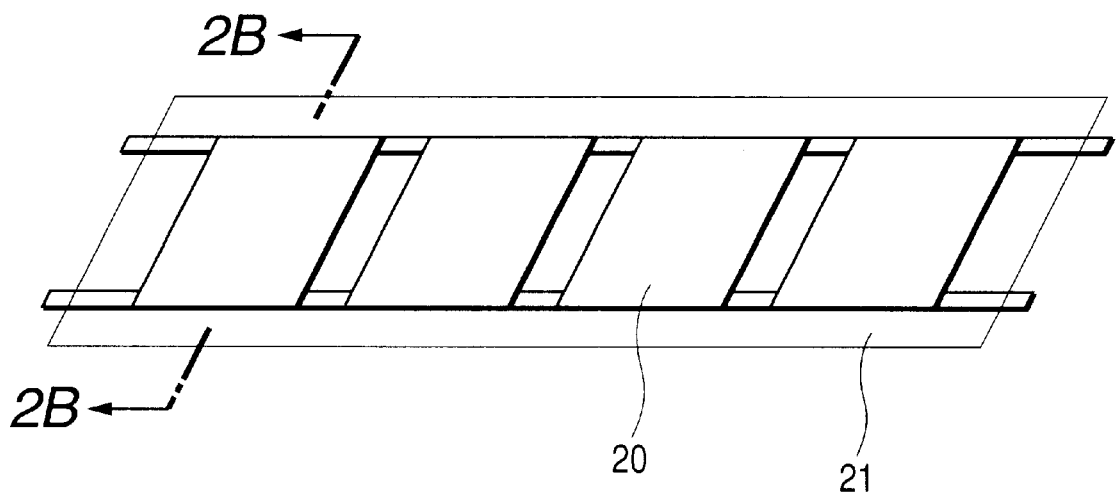
FIG. 2A is a diagrammatic perspective view showing the solar cell module according to an embodiment of the present invention.
Figure 2B:
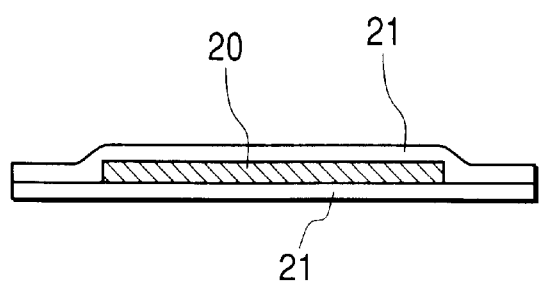
FIG. 2B is a sectional view taken along the line 2B—2B in the FIG. 2A.

An example of a solar cell module of the present invention is diagrammatically shown in FIGS. 2A and 2B. Incidentally, FIG. 2A is an entire diagrammatic perspective view taken showing the solar cell module and FIG. 2B is a sectional view taken along the line 2B—2B in the FIG. 2A.

As shown in FIGS. 2A and 2B, the solar cell module of the present invention is composed of a plurality of photovoltaic elements 20 of the present invention and a covering material 21 having resistance to ambient environments. The photovoltaic elements are electrically connected to each other, and the light-receiving face sides and the non-light-receiving face sides of the photovoltaic elements are coated with the coating material. As the covering material, preferable are a glass plate, a fluororesin, an acrylic resin, a polyethylene terephthalate, polypropylene and the like, however the material is not limited to these materials.

Rectification Layer

The rectification layer is formed between the back electrode layer and the conductive substrate, and it functions as a bypass diode. In the case where voltage in the inverse direction is applied to the photovoltaic layer of a photovoltaic element which does not generate electric power owing to light shielding, the rectification layer bypasses the electric current to prevent the electric current flowing in the photovoltaic layer. On the other hand, the rectification layer also has a function of inhibiting electric current owing to the photoelectric motive force of the photoelectric conversion layer from flowing between the back electrode layer and the conductive substrate.

The resistance value of the rectification layer to the voltage in the inverse direction is preferably not lower than the shunt-resistance value of the photovoltaic elements. Further, the inverse withstand voltage of the rectification layer is more preferable to be not lower than the open voltage of the photovoltaic elements, and the electric current value flowing the rectification layer is more preferable to be not lower than the short-circuit current of the photovoltaic elements.

The materials usable for the rectification layer are same as those of the photoelectric conversion layer, for example, IV-group elements such as Si, C, Ge and the like, IV-group element-containing alloys such as SiGe, SiC and the like, III–V group element containing compounds such as GaAs, InSb, GaP, GaSb, InP, InAs and the like, II–VI group element-containing compounds such as ZnSe, CdTe, ZnS, CdS, CdSe, GdTe and the like, and I–III–VI group element-containing compounds such as $CuInSe_2$ and the like, however they are not limited to these elements and compounds. The rectification layer preferably has at least one pair of the pn junction, the pin junction, the hetero junction or a Schottky barrier. Preferable formation methods for the rectification layer include a variety of chemical vapor deposition method such as a microwave plasma CVD method, a VHF plasma CVD method, a RF plasma CVD method and the like.

Hereinafter, the present invention will be described in details according to examples, however the present invention is not restricted to these examples.

EXAMPLE 1

A magnified sectional view of a through-hole part of the photovoltaic element according to Example 1 of the present invention is shown in FIG. 3.

The photovoltaic element of the present example is composed of a conductive substrate 30, a back reflection layer 31, a photoelectric conversion layer 32, a transparent electrode layer 33, an insulating layer 34, and a back electrode layer 35.

The conductive substrate 30 is made of a 150 µm-thick stainless steel having a plurality of through-hole 36. The diameter of the through-holes 36 is 200 µm and the through-holes 36 are formed by YAG laser. Owing to the short oscillation wavelength, the YAG laser is excellent in light converging characteristics and also owing to excellent absorption properties in a metal, the YAG laser is the optimum for perforating process for forming fine holes in a stainless steel. The average output of the YAG laser at the time of forming the through-holes is 200 W.

The back reflection layer 31 is composed of a ZnO layer 31a and an Al layer 31b and is continuously formed from the major surface of the light-receiving face side of the conductive substrate 30 to a part of the inner wall surface of the through-hole. A sputtering method is employed for formation of the back reflection layer 31, Al is deposited in 500 nm thickness on the conductive substrate, and then ZnO is deposited in 2 µm thickness on the substrate at the substrate temperature of 200° C.

The photoelectric conversion layer 32 is composed of P type, I type, N type amorphous silicon layers which are respectively continuously formed from the major surface of the light-receiving face side of the back reflection layer 31 to a part of the major surface on the non-light-receiving face side through the inner wall surface of the through-holes.

The photoelectric conversion layer 32 is formed using a plasma CVD apparatus. (1) the N type amorphous silicon layer 32a, (2) the I type amorphous silicon layer 32b, and (3) the P type amorphous silicon layer 32C are successively formed in this order.

N Type Amorphous Silicon Layer Formation $H_2$ gas is introduced into a deposition chamber, the flow rate is controlled to be 50 sccm by a mass flow controller and the pressure of the deposition chamber is controlled to be $1.7 \times 10^2$ Pa. A heater is so set as to keep the temperature of the substrate at 220° C. and when the substrate temperature becomes stable, $SiH_4$ gas and $PH_3/H_2$ gas are introduced into the deposition chamber. At that time, the flow rate of $SiH_4$ gas is controlled to be 1 sccm, the flow rate of $PH_3/H_2$ gas is 2.5 sccm, the flow rate $H_2$ gas is 50 sccm, the pressure of the deposition chamber is $1.3 \times 10^2$ Pa. As a high frequency power source, a RF power source of 13.56 MHz is used. The power of the RF power source is set to be 2 W and RF power is applied to RF electrode (a high-frequency introduction part) to generate plasma and then a shutter is opened to start formation of the N type amorphous silicon layer on the ZnO layer, and when the thickness of the layer becomes 10 nm, the shutter is closed and the RF power source is turned off to extinguish plasma and thus formation of the N type amorphous silicon layer is finished. The $SiH_4$ gas and $PH_3/H_2$ gas are stopped flowing in and after $H_2$ gas is continuously introduced to the deposition chamber for 5 minutes, the flow of $H_2$ gas is also stopped and the deposition chamber and the gas pipelines are vacuum exhausted to $1.3 \times 10^{-3}$ Pa.

I Type Amorphous Silicon Layer Formation $H_2$ gas is introduced into a deposition chamber, the flow rate is controlled to be 100 sccm by a mass flow controller and the pressure of the deposition chamber is controlled to be about 67 Pa. A heater is so set as to keep the temperature of the substrate at 250° C. and when the substrate temperature becomes stable, $SiH_4$ gas is introduced into the deposition chamber. At that time, the flow rate of $SiH_4$ gas is controlled to be 4 sccm, the flow rate $H_2$ gas is 100 sccm, and the pressure of the deposition chamber is about 67 Pa. As a high frequency power source, a RF power source of 13.56 MHz is used. The power of the RF power source is set to be 3 W and RF power is applied to RF electrode (high-frequency introduction part) to generate plasma and then a shutter is opened to start formation of the I type amorphous silicon layer on the N type amorphous silicon layer and when the thickness of the layer becomes 400 nm, the shutter is closed and the RF power source is turned off to extinguish plasma and thus formation of the I type amorphous silicon layer is finished. The flow of $SiH_4$ gas to the deposition chamber is stopped, and after $H_2$ gas is continuously introduced to the deposition chamber for 5 minutes, the flow of $H_2$ gas is also stopped and the deposition chamber and the gas pipelines are vacuum exhausted to $1.3 \times 10^{-3}$ Pa.

P Type Amorphous Silicon Layer Formation $H_2$ gas is introduced into a deposition chamber, the flow rate is controlled to be 40 sccm by a mass flow controller and the pressure of the deposition chamber is controlled to be $2.7 \times 10^2$ Pa. A heater is so set as to keep the temperature of the substrate at 250° C. and when the substrate temperature becomes stable, $SiH_4/H_2$ gas and $BF_3/H_2$ gas are introduced into the deposition chamber. At that time, the flow rate of $SiH_4/H_2$ gas is controlled to be 0.25 sccm, the flow rate of $BF_3/H_2$ gas is 2 sccm, the flow rate $H_2$ gas is 40 sccm, the pressure of the deposition chamber is $2.7 \times 10^2$ Pa. As a high frequency power source, a RF power source of 13.56 MHz is used. The power of the RF power source is set to be 40 W and RF power is applied to RF electrode (high-frequency introduction part) to generate plasma and then a shutter is opened to start formation of the P type amorphous silicon layer on the I type amorphous silicon layer and when the thickness of the layer becomes 4 nm, the shutter is closed and the RF power source is turned off to extinguish plasma and thus formation of the P type amorphous silicon layer is finished. The flows of $SiH_4/H_2$ gas and $BF_3/H_2$ gas in the deposition chamber are stopped, and after $H_2$ gas is continuously introduced to the deposition chamber for 5 minutes, the flow of $H_2$ gas is also stopped, and the deposition chamber and the gas pipelines are vacuum exhausted to $1.3 \times 10^{-3}$ Pa.

The transparent electrode layer 33 is composed of ITO. The layer 33 is continuously formed from the major surface of light-receiving face side of the photoelectric conversion layer 32 to a part of the inner wall surface of the through-hole 36. More particularly, using a sputtering apparatus and ITO as a target, $Ar/O_2$ gas as a sputtering gas is introduced at 30 sccm/0.1 sccm and power of 200 W is loaded from a DC power source and while heating the substrate at 200° C., an ITO layer with the thickness of 70 nm is deposited.

The insulating layer 34 is composed of $Si_3N_4$. It is formed to have the thickness of 15 μm continuously from the major surface of the non-light-receiving face side of the conductive substrate 30 to a part of the inner wall surface of the through-hole 36. The exposed parts of the conductive substrate 30 and the back reflection layer 31 in the through-hole inner wall part and its peripheral parts are completely coated with the insulating layer 34. The insulating layer 34 is formed by a sputtering method at a substrate temperature of 200° C.

The back electrode layer 35 is composed of Al. It is formed continuously from the major surface of the non-light-receiving face side of the insulating layer 34 to a part of the inner wall surface of the through-hole 36. The back electrode layer 35 is electrically communicated with the transparent electrode layer 33. Consequently, the electric current generated in the photoelectric conversion layer 32 is led to the back electrode layer 35 through the through-hole 36, so that a grid electrode which shut light can be omitted. The back electrode layer of Al with 10 μm thickness is formed using a sputtering apparatus at a substrate temperature of 200° C.

In the method of producing the photovoltaic element according to Example 1, after the through-holes are formed in the conductive substrate, layers are formed in the following order; (1) the back reflection layer, (2) the photoelectric conversion layer, (3) the transparent electrode layer, (4) the insulating layer and (5) back electrode layer. By forming the layers in this order, after the layers to be formed on the light-receiving face side are all formed, the layers to be on the non-light-receiving face side can be formed. That is, there is a merit of conducting only two steps as the total; the first step of forming the back reflection layer, the photoelectric conversion layer and the transparent electrode layer in one side of a substrate and the second step of forming the insulating layer and the back electrode layer on the other side of the substrate; thereby enabling to form all of the layers in both sides of the substrate.

EXAMPLE 2

A solar cell module according to Example 2 of the present invention is diagrammatically shown in FIGS. 4A to 4C. FIG. 4A is an entire diagrammatic perspective view for showing the solar cell module, FIG. 4B is a magnified view showing the electric connection part B (electric connection part of the photovoltaic element) of FIG. 4A, and FIG. 4C is a sectional view taken along the line 4C—4C in the FIG. 4A. Other points without giving a particular description are the same as those of Example 1.

The solar cell module according to Example 2 is composed of 8 sheets of photovoltaic elements 40 (similar to the photovoltaic element of Example 1), a copper foil 41 electrically connecting the photovoltaic elements to one another, a reinforcing sheet 42 of a 400 μm-thick galvanized steel sheet, a surface protection film 43 of a 50 μm ethylene-tetrafluoroethylene film (ETFE), and an insulating film 44 of a 100 μm-thick poly(ethylene terephthalate). In this case, in order to integrate the photovoltaic elements 40, the reinforcing sheet 42, the surface protection film 43 and the insulating film 44 with each other, a 225 μm-thick EVA sheet 45 is used for an adhesive layer.

The method of producing the solar cell module can be divided into a step of connecting the photovoltaic elements in series and a step of covering the photovoltaic elements connected in series.

After 8 sheets of the photovoltaic elements are arranged in a row in order to connect them in series, each conductive substrate 30 of one of adjacent two elements is electrically connected to each back electrode layer 35 of the other of the adjacent two elements by the copper foil 41. In this case the copper foil is connected to the photovoltaic elements to one another in their corner parts. Each conductive substrate 30 is connected with the copper foil 41, and each back electrode layer 35 is connected with the copper foil 41 by soldering. At the time of electrically connecting the photovoltaic elements, in order to make it possible to easily solder the copper foil to the conductive substrates, the insulating layers 34 and the back electrode layers 35 are removed in the 1 cm×1 cm size in the regions (the corner parts of the photovoltaic elements) to carry out soldering therein. Electric discharge processing is employed as the method for removing the insulating layers 34 and the back electrode layers 35.

After these 8 sheets of photovoltaic elements are connected in series, the insulating film 44 is disposed on the non-light-receiving face side of each photovoltaic elements 40, the reinforcing sheet 42 on the non-light-receiving face side of the foregoing insulating film, and the surface protection film 43 on the light-receiving face side of each photovoltaic element, and the resultant body is vacuum heated using a single vacuum type laminating apparatus. At that time, the production conditions are as follows: after exhaustion for 30 minutes at the exhaust rate of $1.0 \times 10^4$ Pa/sec and the vacuum degree of $6.7 \times 10^2$ Pa, the laminating apparatus is put in a hot wind oven of 160° C. to heat the apparatus for 50 minutes. After that, the laminating apparatus is taken out of the hot wind oven and cooled to an ambient temperature to complete a flat type solar cell module.

EXAMPLE 3

The photovoltaic element according to Example 3 of the present invention is produced by further adding a step of removing burr generated at the time of through-hole formation in the conductive substrate. Consequently, the projected and recessed parts of the conductive substrate due to the burr are lessened and occurrence of the short-circuit fault in subsequent steps can be prevented. Further, a step of removing the short-circuit parts is added after the layers are formed on the light-receiving face side of the conductive substrate, so that the short-circuit parts can be restored and the production yield is improved. Incidentally, other points not particularly mentioned in this example are the same as those in Example 1.

The photovoltaic element of Example 3 is composed of a conductive substrate, a back reflection layer, a photoelectric conversion layer, a transparent electrode layer, an insulating layer, and a back electrode layer, similarly as in Example 1.

After through-hole formation in the conductive substrate and before back reflection layer formation, there inserted is a step of removing burr by electrolytic polishing. Consequently, occurrence of short-circuit in the burr formation points is prevented. More particularly, the conductive substrate of a stainless steel is hung and immersed in an electrolytic solution containing a mixture of phosphoric acid and sulfuric acid, and electric current is applied to dissolve finely projected parts on the surface of the conductive substrate more than the finely recessed parts to smooth the surface.

Further, after formation of the back reflection layer, the photoelectric conversion layer and the transparent electrode layer, there inserted is a step of removing the short-circuit parts in the transparent electrode layer by electrolytic reaction caused by applying voltage between the conductive substrate and a counter electrode in the electrolytic solution. Consequently, the production yield can be improved. Incidentally, the electrolytic solution is composed of $H_2SO_4$ (1%), KOH (0.7%), ethylene glycol (1%), and pure water (97.3%).

Although there available as the method for restoring the short-circuit parts by removing the short-circuit parts of the transparent electrode layer by irradiation of laser, if the short-circuit parts are formed on the inner wall faces of the through-holes, it is extremely difficult to irradiate the short-circuit parts with laser. On the other hand, a method for removing the transparent electrode layer in the short-circuit parts using the electrolytic reaction in the electrolytic solution is capable of easily restoring the short-circuit parts since the electrolytic solution can penetrate the inner wall faces of the through-holes even if the short-circuit parts are formed on the inner wall faces of the through-holes.

The restoring process for the short-circuit parts is composed of the step of repeating application of voltage of 4.4 V for 0.02 second 40 times at 0.05 second intervals in an electrolytic solution adjusted to pH 1.5, having the electric conductivity of 25 mS/cm, and the solution temperature of 25° C., the step of cleaning with pure water at a flow rate of 60 L/min for 1 minute, and the step of drying in a furnace set at 150° C. for 1 minute.

EXAMPLE 4

The photovoltaic element according to Example 4 of the present invention is the same as that of Example 1 except that the back reflection layer is made of nickel and formed by a plating method. By forming the back reflection layer using the plating method, the back reflection layer can be formed even on the major surface in the peripheral parts of the through-holes on the non-light-receiving face side of the conductive substrate. Consequently, the burr generated at the time of through-hole formation is covered with the back reflection layer to reduce irregularities formed by the burr. As a result, short-circuit defects are hardly produced in the burr generated points to increase a yield.

By forming a nickel layer using the nickel method, the layer can be formed on the major surface in the vicinity of the through-holes on the non-light-receiving face side of the conductive substrate in addition to the major surface of the light-receiving face side of the conductive substrate and the inner wall surfaces of the through-holes. Consequently, the burr generated on the non-light-receiving face side of the conductive substrate at the time of through-hole formation is covered to reduce irregularity formed by the burr and it becomes easier to form layers normally in the burr generated points in the subsequent step.

The nickel plating of the conductive substrate is carried out as follows: cathodic electrolytic degreasing is carried out at 10 A/dm² for 5 min. and anodic electrolytic degreasing is carried out at 10 A/dm² for 2 min and then, cleaning with hydrochloric acid is carried out. Next, nickel nucleation is carried out using a nickel strike bath at 3 A/dm² for 30 sec and then nickel plating is performed in a nickel plating bath at 3 A/dm² for 4 minutes. Consequently, a 2 μm-thick nickel plating is formed.

EXAMPLE 5

Figure 7:
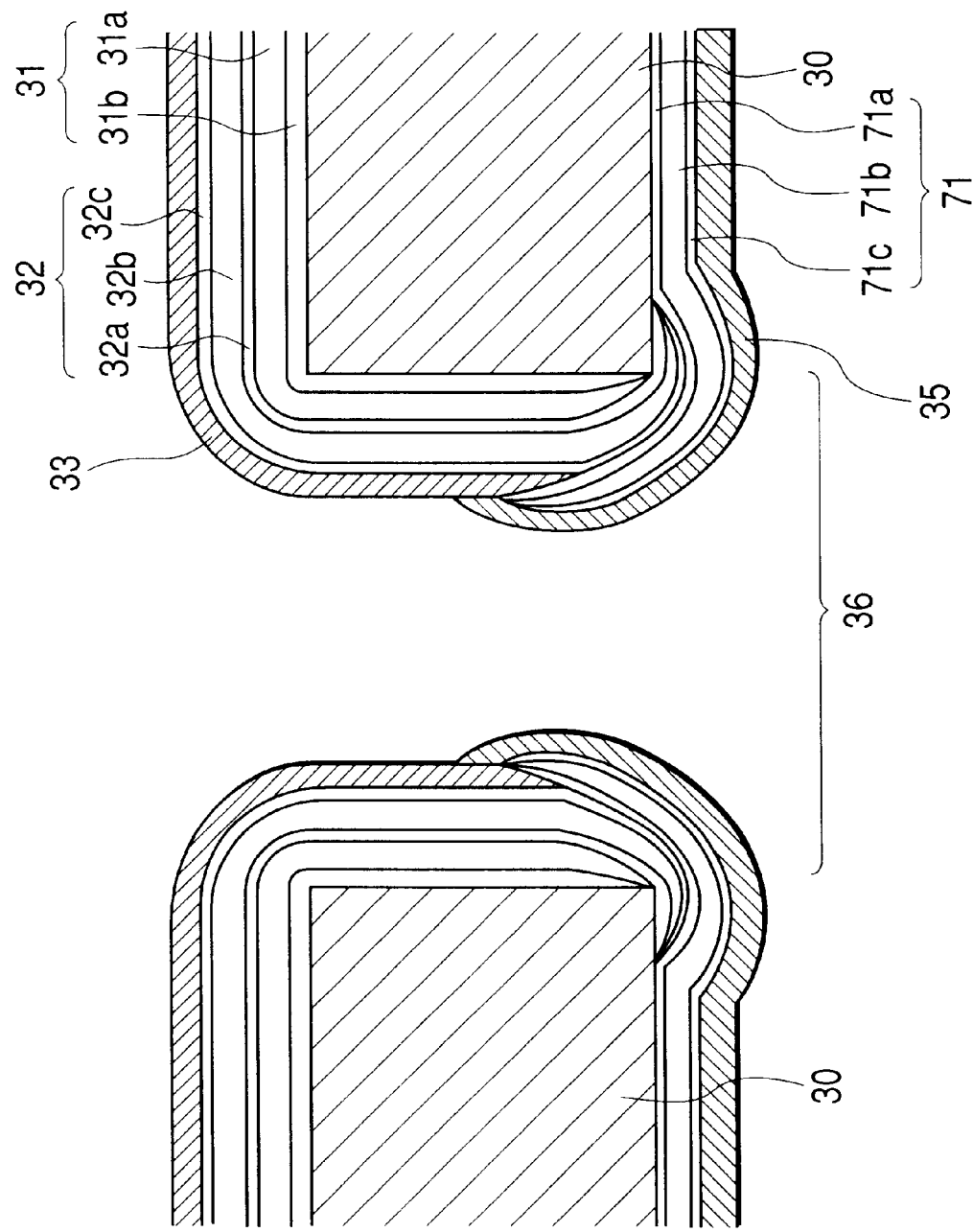
FIG. 7 is a sectional view of a through-hole part of the photovoltaic element according to Example 5 of the present invention.

A magnified sectional view of a through-hole part of the photovoltaic element according to Example 5 of the present invention is shown in FIG. 7.

The photovoltaic element of Example 5 is composed of a conductive substrate 30, a back reflection layer 31, a photoelectric conversion layer 32, a transparent electrode layer 33, a rectification layer 71 and a back electrode layer 35. The photovoltaic element of Example 5 is the same as the photovoltaic element of Example 1 except that the rectification layer 71 is used in place of the insulating layer and that the thickness of the I type amorphous silicon layer is adjusted to be 85 nm.

The rectification layer 71 is composed of a P type amorphous silicon layer with the thickness of 20 nm, an I type amorphous silicon layer with the thickness of 400 nm, and an N type amorphous silicon layer with the thickness of 20 nm. The rectification layer is continuously formed from the major surface on the non-light-receiving face side of the conductive substrate to a part of the inner wall surface of the through-hole. Using a plasma CVD apparatus for formation of the rectification layer 71, (1) the P type amorphous silicon layer 71a, (2) the I type amorphous silicon layer 71b, and (3) the N type amorphous silicon layer 71c are formed in this order in the same film formation conditions as those in the formation of photoelectric conversion layer 32. Consequently, since a work for post-attaching bypass diodes to the photovoltaic elements one by one can be omitted to make the mass production line easy.

The photovoltaic element can be produced by successively forming (1) the back reflection layer, (2) the photoelectric conversion layer, (3) the transparent electrode layer, (4) the rectification layer and (5) the back electrode layer in this order after the formation of the through-holes in the conductive substrate.

EXAMPLE 6

The solar cell module of Example 6 is the same as the solar cell module of Example 2 except the photovoltaic element of Example 5 is used in place of the photovoltaic element of Example 1. A solar cell module according to Example 6 of the present invention is diagrammatically shown in FIGS. 4A to 4C. FIG. 4A is an entire diagrammatic perspective view showing the solar cell module, FIG. 4B is a magnified view showing part B (electric connection part of the photovoltaic element) of FIG. 4A, and FIG. 4C is a sectional view taken along the line 4C—4C in the FIG. 4A. Other points without giving particular description are the same as those of Example 5.

The solar cell module according to Example 6 is composed of 8 sheets of photovoltaic elements 40 (similar to the photovoltaic element of Example 5), a copper foil 41 electrically connecting the photovoltaic elements to one another, a reinforcing sheet 42 of a 400 μm-thick galvanized steel sheet, a surface protection film 43 of a 50 μm ethylene-tetrafluoroethylene film (ETFE), and an insulating film 44 of a 100 μm-thick poly(ethylene terephthalate) film. In this case, in order to integrate the photovoltaic elements 40, the reinforcing sheet 42, the surface protection film 43 and the insulating film 44 with each another, a 225 μm-thick EVA sheet 45 is used for an adhesive layer.

After 8 sheets of the photovoltaic elements are arranged in a row in order to connect them in series, each conductive substrate 30 of one of adjacent elements is electrically connected to each back electrode layer 35 of another element by the copper foil 41. In this case, the copper foil connects photovoltaic elements to one another in their corner parts. Each conductive substrate 30 is connected with the copper foil 41, and each back electrode layer 35 is connected to the copper foil 41, respectively, by a conductive adhesive. At the time of electrically connecting the photovoltaic elements, in order to make it possible to easily connect the copper foil to the conductive substrates, the rectification layer 71 and the back electrode layer 35 are removed in the 1 cm×1 cm size in the regions (the corner parts of the photovoltaic elements) to which the conductive adhesive is to be applied. Electric discharge processing is employed as the method for removing the rectification layer 71 and the back electrode layer 35.

EXAMPLE 7

The photovoltaic element according to Example 7 of the present invention is produced by further adding a step of removing burr generated at the time of through-hole formation in the conductive substrate. The method of producing the photovoltaic element of Example 7 is the same as that in Example 3 except that the photovoltaic element of Example 5 is employed in place of the photovoltaic element of Example 1. Removal of the burr is carried out in the same manner as Example 3. The projected and recessed parts of the conductive substrate are suppressed and occurrence of the short-circuit faults in the subsequent steps can be prevented. Further, by adding a step of removing the short-circuit points after the formation of layers on the light-receiving face side of the conductive substrate, the short-circuit points are restored and the production yield is improved.

The photovoltaic element of Example 7 is composed of a conductive substrate, a back reflection layer, a photoelectric conversion layer, a transparent electrode layer, a rectification layer, and a back electrode layer similarly as in Example 5.

The insertion of the step of removing burr by electrolytic polishing after formation of the through-holes in the conductive substrate consequently prevents occurrence of short-circuit in the points where burr is formed.

EXAMPLE 8

The photovoltaic element according to Example 8 comprises a back reflection layer of nickel which is formed by nickel plating. The method of producing the photovoltaic element of Example 8 is the same as that of Example 5 except that the back reflection layer is made of nickel and formed by a plating method. The formation of the back reflection layer of nickel by the plating method is carried out in the same manner as Example 3. By forming the back reflection layer using the plating method, the back reflection layer can be formed even on the major surface in the peripheral parts of the through-holes on the non-light-receiving face side of the conductive substrate. Consequently, the burr generated at the time of through-hole formation is covered with the back reflection layer and the projected and recessed parts formed by the burr can be suppressed. As a result, short-circuit faults difficultly occur in the subsequent steps to improve the production yield.

As described above, according to the present invention, formation of the photoelectric conversion layer, the transparent electrode layer, the insulating layer and the back electrode layer on the conductive surface having the through-holes in this order makes it no need to carry out three or more steps if one step is defined as a step of forming a plurality of layers on one side surface of a substrate. Since the number of the steps can be decreased. The productivity of the photovoltaic element can be improved.

Further, the production yield can be improved by adding a step of removing the burr by electrolytic polishing after through-hole formation in the conductive substrate and a step of removing the short-circuit parts after formation of the transparent electrode layer.

Further, according to the present invention, formation of the rectification layer having a function as a bypass diode makes it possible to integrate a bypass diode with the photovoltaic element. Consequently, a work of post-attaching a bypass diode to each photovoltaic element after formation of the respective layers of each photovoltaic element can be omitted to improve the productivity of the photovoltaic element.

Further, by making the photovoltaic element as a bypass diode-integrated type one, projected and recessed parts due to the bypass diode can be eliminated to improve the processibility.

What is claimed is:

1. A method of producing a photovoltaic element comprising a conductive substrate having a through-hole, a transparent electrode layer and a photoelectric conversion layer in this order from a light-receiving face side of the conductive substrate on a major surface of the light-receiving face side of the conductive substrate, and an insulating layer and a back electrode layer in this order from the light-receiving face side on a major surface of a non-light-receiving face side of the conductive substrate; the method comprising:
   a first step of successively forming the photoelectric conversion layer and the transparent electrode layer on the major surface of the light-receiving face side of the conductive substrate and on an inner wall face of the through-hole; and
   a second step of successively forming the insulating layer and the back electrode layer on the major surface of the non-light-receiving face side of the conductive substrate and on the inner wall face of the through-hole.

2. The method according to claim 1, further comprising a step of producing the conductive substrate having the through-hole by perforating a through-hole in a conductive substrate, where burr to be generated in through-hole formation is mainly generated on the non-light-receiving face side of the conductive substrate.

3. The method according to claim 2, wherein the step of forming the through-hole is a punching step using a punch and a die which is conducted by punching the conductive substrate from the light-receiving face side while arranging the punch on the light-receiving face side of the conductive substrate and the die on the non-light-receiving face side.

4. The method according to claim 2, wherein the step of forming the through-hole is a laser processing step which is conducted by irradiation of laser beam from the light-receiving face side of the conductive substrate.

5. The method according to claim 2, further comprising a step of removing burr generated in the through-hole formation between the step of forming the through-hole and the first step.

6. The method according to claim 5, wherein the step of removing the burr is carried out by electrolytic polishing.

7. The method according to claim 1, wherein formation of the photoelectric conversion layer in the first step is carried out by a chemical vapor deposition method.

8. The method according to claim 1, wherein a step of selectively removing the transparent electrode layer is inserted between the first step and the second step.

9. The method according to claim 1, wherein a short-circuit point removal step of restoring short-circuit fault is inserted between the first step and the second step.

10. The method according to claim 9, wherein the short-circuit point removal step is carried out by causing electrolytic reaction by applying voltage between the conductive substrate and a counter electrode in an electrolytic solution.

11. The method according to claim 1, wherein formation of the insulating layer in the second step is carried out by a chemical vapor deposition method.

12. A photovoltaic element comprising:
   a conductive substrate having a through-hole;
   a transparent electrode layer and a photoelectric conversion layer in this order from a light-receiving face side of the conductive substrate on a major surface of the light-receiving face side of the conductive substrate; and
   a rectification layer and a back electrode layer in this order from the light-receiving face side on a major surface of a non-light-receiving face side of the conductive substrate,
   wherein the photoelectric conversion layer and the transparent electrode layer are formed continuously from the major surface of the light-receiving face side to at least a part of an inner wall face of the through-hole; the rectification layer and the back electrode layer are formed continuously from the major surface of the non-light-receiving face side to at least a part of the inner wall face of the through-hole; the transparent electrode layer and the back electrode layer are electrically communicated with each other through the through-hole; and a rectification characteristic of the rectification layer is in an inverse direction to a voltage of a photoelectric motive force of the photoelectric conversion layer.

13. The photovoltaic element according to claim 12, wherein the photoelectric conversion layer is continuously formed from the major surface of the light-receiving face side to at least a part of the major surface of the non-light-receiving face side through the through-hole.

14. The photovoltaic element according to claim 12, wherein the conductive substrate is so arranged as to leave burr or burr residues generated in the formation of the through-hole of the conductive substrate mainly on the non-light-receiving face side.

15. The photovoltaic element according to claim 12, wherein a shape of the through-hole is approximately circular as viewed from the major surface of the light-receiving face side and as viewed from the major surface of the non-light-receiving face side and satisfies that T/D is 1 or lower, wherein T denotes a thickness of the conductive substrate and D denotes a hole diameter of the through-hole.

16. The photovoltaic element according to claim 12, wherein a shape of the through-hole is approximately rectangular as viewed from the major surface of the light-receiving face side and as viewed from the major surface of the non-light-receiving face side and satisfies that T/L is 1 or lower, wherein T denotes a thickness of the conductive substrate and L denotes a width of the through-hole in a shorter side thereof.

17. The photovoltaic element according to claim 12, further comprising a back reflection layer between the conductive substrate and the photoelectric conversion layer, wherein the back reflection layer is formed continuously from the major surface of the light-receiving face side to at least a part of the inner wall face of the through-hole.

18. The photovoltaic element according to claim 12, further comprising a back reflection layer between the conductive substrate and the photoelectric conversion layer, wherein the back reflection layer is formed continuously from the major surface of the light-receiving face side to at least a part of the major surface of the non-light-receiving face side through the through-hole.

19. The photovoltaic element according to claim 17, wherein the back reflection layer is composed of a metal layer and a semiconductor layer.

20. The photovoltaic element according to claim 12, wherein the rectification layer has any one selected from the group consisting of a PN junction, a PIN junction, a hetero junction and a Schottky barrier.

21. The photovoltaic element according to claim 12, wherein the rectification layer is composed of amorphous, crystalline, or a mixture of amorphous and crystalline material.

22. The photovoltaic element according to claim 12, wherein the rectification layer is composed of any one selected from the group consisting of an amorphous silicon-based semiconductor, a microcrystalline silicon-based semiconductor, a polycrystalline silicon-based semiconductor, and a polycrystalline compound-based semiconductor.

23. The photovoltaic element according to claim 12, wherein the photoelectric conversion layer has any one selected from the group consisting of a PN junction, a PIN junction, a hetero junction and a Schottky barrier.

24. The photovoltaic element according to claim 12, wherein the photoelectric conversion layer is composed of amorphous, crystalline, or a mixture of amorphous and crystalline material.

25. The photovoltaic element according to claim 12, wherein the photoelectric conversion layer is composed of any one selected from the group consisting of an amorphous silicon-based semiconductor, a microcrystalline silicon-based semiconductor, a polycrystalline silicon-based semiconductor, and a polycrystalline compound-based semiconductor.

26. The photovoltaic element according to claim 12, wherein the conductive substrate is made of a flexible metal sheet.

27. A solar cell module comprising a photovoltaic element as claimed in claim 12 and a sealing material, wherein at least a part of the photovoltaic element is covered with the sealing material.

28. A method of producing a photovoltaic element comprising a conductive substrate having a through-hole, a transparent electrode layer and a photoelectric conversion layer in this order from a light-receiving face side of the conductive substrate on a major surface of the light-receiving face side of the conductive substrate, and a rectification layer and a back electrode layer in this order from the light-receiving face side on a major surface of a non-light-receiving face side of the conductive substrate; the method comprising:

a first step of successively forming the photoelectric conversion layer and the transparent electrode layer on the major surface of the light-receiving face side of the conductive substrate and on an inner wall face of the through-hole; and a second step of successively forming the rectification layer and the back electrode layer on a major surface of a non-light-receiving face side of the conductive substrate and on the inner wall face of the through-hole, wherein a rectification characteristic of the rectification layer is in an inverse direction to a voltage of a photoelectric motive force of the photoelectric conversion layer.

29. The method according to claim 28, comprising a step of producing the conductive substrate having the through-hole by perforating a through-hole in a conductive substrate, wherein the through-hole is formed so that burr generated in the through-hole formation is mainly generated on the non-light-receiving face side of the conductive substrate.

30. The method according to claim 29, wherein the step of forming the through-hole is a punching step using a punch and a die which is conducted by punching the conductive substrate from the light-receiving face side while arranging the punch on the light-receiving face side of the conductive substrate and the die an the non-light-receiving face side.

31. The method according to claim 29, wherein the step of forming the through-hole is a laser processing step which is conducted by irradiation of laser beam from the light-receiving face side of the conductive substrate.

32. The method according to claim 29, further comprising a step of removing the burr generated in the through-hole formation between the step of forming the through-hole and the first step.

33. The method according to claim 32, wherein the step of removing the burr is carried out by electrolytic polishing.

34. The method according to claim 28, wherein the formation of the photoelectric conversion layer in the first step is carried out by a chemical vapor deposition method.

35. The method according to claim 28, further comprising a step of selectively removing the transparent electrode layer between the first step and the second step.

36. The method according to claim 28, further comprising a short-circuit point removal step of restoring short-circuit fault between the first step and the second step.

37. The method according to claim 35, wherein the short-circuit point removal step is carried out by causing electrolytic reaction by applying a voltage between the conductive substrate and a counter electrode in an electrolytic solution.

38. The method according to claim 28, wherein formation of the rectification layer in the second step is carried out by a chemical vapor deposition method.

* * * * *

UNITED STATES PATENT AND TRADEMARK OFFICE
CERTIFICATE OF CORRECTION

PATENT NO. : 6,613,973 B2
DATED : September 2, 2003
INVENTOR(S) : Takaaki Mukai et al.

It is certified that error appears in the above-identified patent and that said Letters Patent is hereby corrected as shown below:

Column 24,
Line 1, "comprising" should read -- further comprising --.
Line 28, "die an" should read -- die on --.

Signed and Sealed this

Twenty-ninth Day of June, 2004

JON W. DUDAS
*Acting Director of the United States Patent and Trademark Office*